United States Patent [19]

Peltier et al.

[11] 3,987,310

[45] Oct. 19, 1976

[54] SCHOTTKY DIODE - COMPLEMENTARY TRANSISTOR LOGIC

[75] Inventors: Arthur William Peltier, Mesa; Leo L. Wisseman, Scottsdale, both of Ariz.

[73] Assignee: Motorola, Inc., Chicago, Ill.

[22] Filed: June 19, 1975

[21] Appl. No.: 588,538

[52] U.S. Cl. .............................. 307/215; 307/214; 307/313; 307/317 A
[51] Int. Cl.² .................. H03K 19/08; H03K 19/12; H03K 19/34; H03K 19/36
[58] Field of Search................ 307/214, 215, 317 A, 307/255, 313; 357/15

[56] References Cited
UNITED STATES PATENTS

| | | | |
|---|---|---|---|
| 3,349,297 | 10/1967 | Crowell et al. ........................ | 357/15 |
| 3,719,797 | 3/1973 | Andrews, Jr. et al. ....... | 307/317 A X |

OTHER PUBLICATIONS

Gani et al., "Logic Circuit with Dual—Metal Schottky Barrier Diodes," *IBM Tech. Discl.;* vol. 17, No. 10, p. 2856; 3/1975.

Gani et al., "Dual—Diode Logic Gate and Oscillation Clamping Structure"; *IBM Tech. Discl. Bull.*, vol. 17, No. 2, p. 414; 7/1974.

Park, "Polarity Hold Latch with Schottky Diode and Circuits"; *IBM Tech. Discl. Bull.;* vol. 16, No. 5, pp. 1634–1635; 10/1973.

*Primary Examiner*—John S. Heyman
*Assistant Examiner*—Larry N. Anagnos
*Attorney, Agent, or Firm*—Harry M. Weiss; Robert A. Farley

[57] ABSTRACT

A logic circuit uses an input Schottky diode of a first threshold and a clamp Schottky diode of a second threshold in combination with a high speed NPN switching transistor to form a simple high speed logic element. The novel use of two Schottky diodes of different threshold voltages provides a logic gate with a lower logic swing amenable with higher speed operation. Further, the operation of the logic gate is independent of the temperature characteristics of the NPN switching transistor. A PNP current source provides the drive current and load current for the logic gate in a simple manner which uses minimum chip area.

10 Claims, 4 Drawing Figures

3,987,310

SCHOTTKY DIODE - COMPLEMENTARY TRANSISTOR LOGIC

BACKGROUND

As is well known in the prior art, logic structures of type referred to as direct coupled transistor logic (DCTL) provide high speed operation with a minimum number of transistor elements. Traditionally, this form of logic has suffered from major limitations. One major problem is base drive current "starvation" due to the current hogging characteristics of DCTL transistors connected in parrallel. Another major limitation is the innerconnection problem which results from the fact that each switching element in a logic structure is a separate and distinct transistor which must receive a distinct input connection and a distinct output connection. Traditionally, the problem posed by DCTL structures have been solved by adopting other integrated circuit logic forms which eliminate innerconnection problems by combining device functions into a single structure in TTL integrated circuits, for example, multiple emitters are used to provide multiple input connections to a single logic element. In other prior art logic forms such as ECL, the circuit structure of the logic element and circuit design which provides for a nonsaturating operation obtains higher speed operation at the expense of higher power dissipation.

Logic circuit family is based on bipolar transistor technology and other related technologies is presently evolving at a rapid rate. New logic families such as integrated injection logic (I²L), offer simplified processing, higher packing density, higher efficiency and improved performance relative to other competitive logic forms such as MOS. Within this framework of evolving bipolar technology, the circuit design potential of Schottky diodes with their inherently simple structure has been long recognized. Further, the high packing intensities implicit in their small size has prompted investigations into differing methods by which they might be employed to accomplish bipolar logic functions.

SUMMARY OF THE INVENTION

Accordingly, it is an object of this invention to provide an improved logic circuit for implementing high density monolithic integrated circuit structures.

It is a further object of this invention to provide an improved logic circuit which uses an input diode of a first threshold, a clamp diode of a second threshold, and a high speed switching transistor to provide inversion and signal amplification.

It is a further object of this invention to provide a new logic circuit which has a logic 1 to logical 0 threshold point which is centered in the signal swing over the operating temperature range.

It is a further object of the invention to provide a logic circuit which has a low output impedance and a high input impedance.

A further object of this invention is to provide a logic circuit which has a extremely low speed power product which can be varied by the user.

A further object of this invention is to provide an improved logic circuit in which all transistor elements are referenced directly to logic system ground.

A further object of this invention is to provide an improved logic circuit which operates at a constant current, eliminating switching transients.

DETAILED DESCRIPTION

Figure 1:
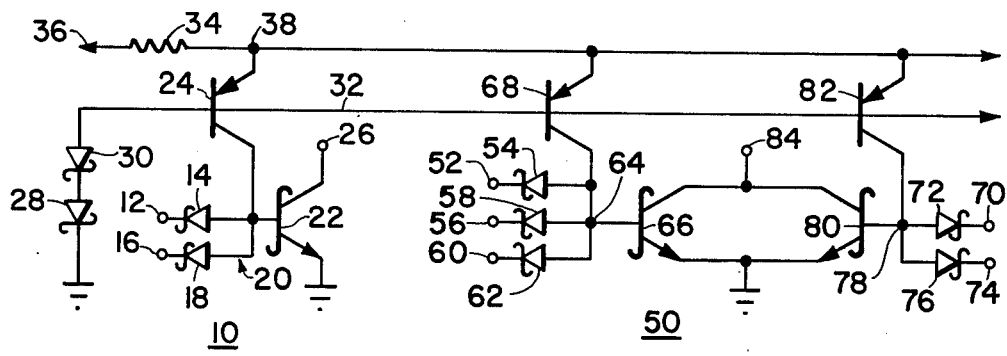
FIG. 1 shows a NAND gate and AND/NOR gate implemented using Schottky diode-complementary transistor logic circuits.
Figure 2:
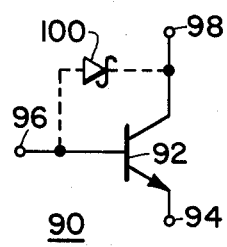
FIG. 2 shows an equivalent circuit of a Schottky clamped NPN switching transistor.

FIG. 1 shows a preferred embodiment for the Schottky diode-complementary transistor logic of the present invention. FIG. 1 shows a logical NAND gate 10 which has an input terminal 12 coupled to the cathode of Schottky diode 14 and input terminal 16 coupled to the cathode of Schottky diode 18. The anodes of Schottky diode 14 and 18 couple to node 20 which connects to the base terminal of switching transistor 22 and the collector terminal of current source transistor 24. The emitter of transistor 22 connects to ground and the collector of transistor 22 forms the output terminal 26 of the NAND gate. Transistor 22 is a Schottky clamped transistor which has an equivalent circuit structure as shown in FIG. 2. NAND gate 10 also makes use of Schottky diodes 28 and 30 to form a reference voltage for the current source transistor 24. The cathode of diode 28 connects to ground. The cathode of diode 30 connects to the anode of diode 28. The anode of diode 30 connects to node 32 which connects to the base of transistor 24 and to the remaining logic circuitry of FIG. 1 which is discussed below. The logic circuitry of FIG. 1 also contains a current limiting resistor 34 which connects to a $V_{CC}$ power supply terminal 36 and to conductor 38 which connects to the emitter of current source transistor 24 and to the remaining logic circuitry of FIG. 1.

FIG. 1 also shows a AND/NOR gate 50. This gate has an input terminal 52 coupled to the cathode of a Schottky diode 54, and input terminal 56 coupled to the cathode of a Schottky diode 58 and an input terminal 60 coupled to the cathode of a Schottky diode 62. The anodes of Schottky diodes 54, 58 and 62 coupled to a common node 64 which couples to the base of a Schottky switching transistor 66 and to the collector of a current source transistor 68.

AND/NOR gate 50 also includes input terminals 70 which connects to the cathode of Schottky diode 72 and input terminal 74 which connects to the cathode of Schottky diode 76. The anodes of Schottky diode 72 and 76 connect the common node 78 which connects to the base of Schottky switching transistor 80 and to the collector of current source transistor 82. The base terminal of current source transistor 68 and current source transistor 82 connect to reference voltage conductor 32 which is common also to NAND gate 10 previously discussed. Similarly, the emitter terminal of current source transistor 68 and the emitter terminal of current source transistor 82 connect to source voltage conductor 38 which is also common with NAND gate 10 previously discussed. The emitter terminals of Schottky switching transistor 66 and Schottky switching transistor 80 connect to ground while the collector terminals of transistor 66 and transistor 80 connect to conductor 84 which forms the output terminal of the AND/NOR gate 50.

FIG. 2 shows a circuit 90 which is the functional equivalent of a Schottky transistor. The circuit comprises a NPN transistor 92 with a emitter terminal 94, a base terminal 96 and a collector terminal 98. The remainder of the equivalent circuit comprises a Schottky barrier diode 100 whose anode connects to the base terminal 96 and whose cathode connects to the collector terminal 98. The Schottky diode 100 provides a shunt path for base current flowing into terminal 96.

Figure 3:
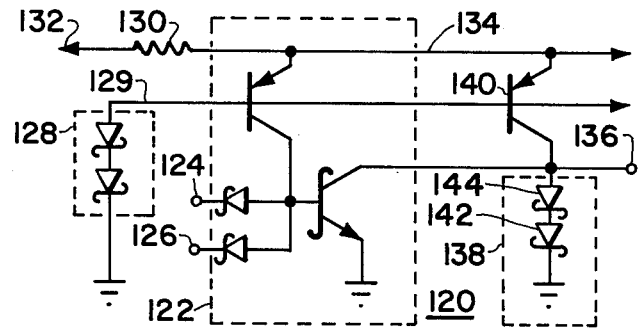
FIG. 3 shows a Schottky diode-complementary transistor logic circuit with a constant current active pull-up output circuit.

FIG. 3 shows another version of the Schottky diode-complementary transistor logic of the present invention in which a constant current active pull up circuit is added to provide improved capability for driving circuits external to an integrated circuit chip. The circuit 120 comprises a basic NAND gate with two input terminals 124 and 126. A diode network 128 is used to provide a reference voltage for the constant current portion of the NAND gate 122 while the current limiting resistor 130 which connects to the power supply terminal 132, provides a power source for the NAND gate via conductor 134. The output circuit coupled to output terminal 136 of the two input NAND gate 122 comprises a voltage reference circuit 138 and a constant current source transistor 140. The voltage reference circuit 128 comprises Schottky diodes 142 and 144. The cathode of Schottky diode 142 connects to ground. The cathode of Schottky diode 144 connects to the anode of Schottky diode 142 and the anode of Schottky diode 144 connects to the output terminal 136. The base terminal of current source transistor 140 connects to conductor 129 which provides the reference voltage required for constant current operation. Conductor 129 also connects to additional gate and active load circuits not shown in FIG. 3. The emitter terminal of current source transistor 140 connects to power supply conductor 134 which also connects to other gate and active load circuits not shown in FIG. 3. Operation of the Schottky diode-complementary transistor logic will be explained in terms of the basic NAND gate 10 shown in FIG. 1. NAND gate 10 consists of four basic components which are the NPN switching transistor 22 which is a Schottky clamped device, the PNP transistor 24 which serves as a current source and a load device, the Schottky diodes 28 and 30 which provide a reference voltage for the current source transistor 24 and input diodes 14 and 18 which are Schottky barrier diodes fabricated with different metals to obtain the desired characteristics of the NAND gate. The basic operation of the Schottky diode-complementary transistor gate is by steering the collector current of transistor 24. When all inputs to NAND gate 10 are high, current is steered into the base of NPN switching transistor 22, forcing it to conduct. Since transistor 22 is a Schottky clamped device, the conduction of transistor 22 will be limited since the collector terminal of transistor 22 can be no more than a Schottky threshold voltage below the voltage at the base terminal of transistor 22. When one of the inputs 12 or 16 becomes low, transistor 24's collector current is steered through the forward bias input diode 14 or 18 turning the NPN switching transistor 22 off. Thus, the output terminal 26 of NAND gate 10 can only be in the low state when both input terminal 12 and input terminal 16 are in the high state as is required by the NAND function.

The NPN switching transistor 22 is a Schottky clamp device operating in the forward, common emitter mode. In the preferred embodiment, this device has a full conduction VBE of about 775 millivolts and this base emitter voltage has a temperature co-efficient of about 2 millivolts per degrees C. The typical initial conduction threshold is at a $V_{BE}$ of 650 millivolts. A loaded conducting Schottky clamped NPN switching transistor such as transistor 22 has a $V_{CE}$ of about 250 millivolts. Thus, in the typical embodiment, the logic swing at 25° C is the difference between these voltages or about 500 millivolts. In the typical embodiment the current gain of the PNP current source device 24 should be 4 or 5 for efficient operation, although the logic will still function at unity current gain.

Schottky barrier diodes having different contact potential are essential to the operation of the Schottky diode-complementary transistor logic of the present invention. The temperature co-efficient of a metal-silicon Schottky barrier diode is about 1.1 millivolts per degree centigrade, approximately one half that of a diffused junction diode. In the preferred embodiment, the Schottky diodes 28 and 30 and the Schottky diode clamps for the NPN switching transistors, for example, switching transistor 22 of NAND gate 10 are platinum silicide diodes. Schottky diodes of this type have a forward voltage of approximately 525 millivolts, set by diode area and current density. The input Schottky diodes typified by diodes 14 and 18 in NAND gate 10 must have a low forward voltage in order to obtain proper logic gate operation. In the preferred embodiment, titanium, which results in a forward diode threshold voltage of 125 millivolts or tungsten which results in a forward diode threshold voltage of 200 millivolts would make suitable input Schottky diodes. These diodes are formed at the collector of the driving transistors and isolate the outputs from each other. They also maintain input threshold at the same relative point in the signal swing over the temperature range. Referring again to NAND gate 10, when one of the input Schottky diodes 14 or 18 is conducting to steer current away from the base of transistor 22, the potential at the base of transistor 22 will be about 375 millivolts. Since 650 millivolts is required to initiate conduction, the logical 0 noise margin is 275 millivolts. When the simple open collector output connection illustrated by NAND gate 10 or by the AND/NOR gate 50 of FIG. 1 is used, the logical 1 noise margin will be more sensitive. Referring to NAND gate 10, inputs 12 and 16 will both connect to the collectors of NPN switching transistors of preceding logic gates and these NPN switching transistors will be nonconducting. This diverts all current from current source transistor 24 into the base of switching transistor 22. As the base of transistor 22 is charged to its fully conducting 775 millivolt potential, inputs 12 and 16 will charge to about 700 millivolts quite rapidly. It will then take a voltage change of from 75 millivolts to 100 millivolts at input 12 or input 16 to significantly affect the fully conducting state of transistor 22 because of the forward voltage characteristics of the input diodes 14 and 18. Thus, the logical 1 noise margin in this case is about 100 millivolts.

Although direct connection from open collector output to Schottky diode input of gates such as those embodied in FIG. 1 is adequate for logic structures fabricated on a single chip, off-chip interfacing generally requires the use of a constant current active pull-up circuit. FIG. 3 shows a preferred embodiment of the constant current active pull-up circuit which functions such that when the switching transistor of 122 is non-conducting, the logic 1 level at output terminal 136 is determined by the voltage reference 138 which comprises the forward biased diodes 142 and 144 conducting current determined by the characteristics of current source device 140.

Figure 4:
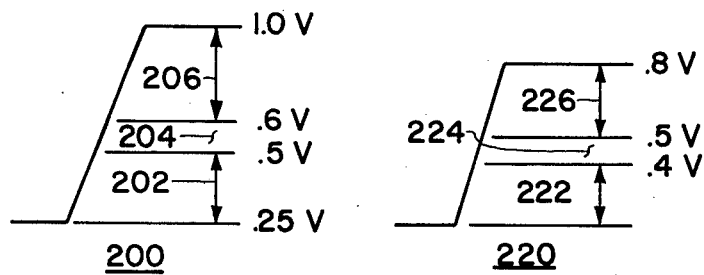
FIG. 4 shows a comparison of logic threshold for the Schottky diode-complementary transistor logic circuit at 25° C and 125° C.

The Schottky diode-complementary transistor logic illustrated by the preferred embodiment of FIG. 1 is inherently temperature compensated. The additive temperature coefficient of the serially interconnected diode 28 and diode 30 is nearly identical to the base emitter temperature coefficient of switching transistor 22. This will maintain transistor 24 in the linear active region over extreme temperature variations. The same result could be accomplished by using a single junction diode for the serially connected Schottky diodes 28 and 30. FIG. 4 shows output waveforms of the preferred embodiment NAND gate 120 of FIG. 3 which illustrates the effect of temperature compensation. Waveform 200 shows the output waveform at 25° C while waveform 220 shows the output waveform at 125° C. Waveform 200 has a logic 0 band 202 ranging from 0.25 volts to 0.5 volts a threshold band 204 ranging from 0.5 to 0.6 volts and a logic 1 band 206 ranging from 0.6 volts to 1.0 volts. Similarly, waveform 220 has a logic 0 band 222 ranging from 0.2 volts to 0.4 volts, a threshold band 224 ranging from 0.4 volts to 0.5 volts and a logic 1 band 226 ranging from 0.5 volts to 0.8 volts. Examination of these waveforms shows that the threshold band maintains the same relative position over the temperature range due to the compensating temperature coefficients previously discussed.

Analysis of the dynamic performance of the logic gate of the present invention provides the following formula for the preferred embodiment NAND gate 10 shown in FIG. 1:

$$\Delta T = C \times \Delta V \div I$$

where
$\Delta T$ = High to low switching time
$C$ = Device capacitance
$\Delta V$ = The voltage change for turn on, and
$I$ = Constant current value (device 24)

Assuming that two driving gates must be charged (open collector internal connection) and that small geometry devices are used, C would be about 3.2 picofarads. A reasonable value for $\Delta V$ is 400 millivolts and I is assumed to be 100 microamps. Substituting these values in equation 1 gives the result:

$$\Delta T = 12.8 \text{ nanoseconds}$$

Low to high switching time is constrained by the high frequency characteristics of the NPN switching transistor rather than the capacitance to source current ratio. With all gates receiving the same drive current, available discharge current is the current source value I multiplied by the $\beta$ of the output NPN switching transistor. With a base drive of 100 microamps, a NPN $\beta$ of 20 and a fan out of five, typical parasitic capacitance would be discharged in less than 1 nanosecond. However, switching time is limited by the $\beta$ cutoff frequency of the NPN switching transistor and for the preferred embodiment the switching time is approximately equal to the reciprocal of the $\beta$ cutoff frequency or about 2 nanoseconds.

The speed power product (SPP) can be calculated for the NAND gate 10 of the preferred embodiment shown in FIG. 1 as follows: assuming a $\beta$ of five for the PNP current source transistor 24, a $V_{CC}$ voltage equal 2.5 volts applied to terminal 36, and an NPN switching transistor base driver requirement of 100 microamps per gate, the power per gate will be given by the formula:

$$P = (100 + \frac{100}{\beta}) \times (2.5 \text{ volts})$$

$$P = 300 \text{ microwatts per gate}$$

using an average propogation delay, $$SPP = 0.3 \text{ milliwatts} \times 7.4 \text{ nanoseconds} =$$

$$SPP = 2.22 \text{ picojewels per gate}$$

using different biasing for the current source transistor 24 and with the $V_{CC}$ power supply voltage applied to terminal 36 equal 1.5 volts, a $SPP = 1.33$ picojewels is obtained. These low values of speed power product compare favorably with other types of logic circuits currently in use.

What is claimed is:
1. A semiconductor integrated logic circuit comprising:
   a. a first and a second power supply conductor;
   b. a first reference voltage means;
   c. a NPN switching transistor having an emitter coupled to said first power supply conductor, having a collector forming the output terminal of said logic circuit and having a base;
   d. a first Schottky diode having an anode and a cathode and having a first threshold votlage, said anode connected to said base of said NPN transistor and said cathode connected to said collector of said NPN transistor;
   e. a second Schottky diode having an anode and a cathode and having a second threshold voltage, said anode connected to the base of said NPN transistor and said cathode forming an input terminal of said logic circuit; and
   f. a first PNP current source transistor having an emitter coupled to said second power supply conductor, a base coupled to said first reference voltage means and a collector coupled to the base of said NPN transistor.

2. A semiconductor integrated logic circuit as recited in claim 1 further comprising a current limiting resistor having a first terminal coupled to said second power supply conductor and a second terminal coupled to said emitter of said PNP current source transistor.

3. A semiconductor integrated logic circuit as recited in claim 2 further comprising a third Schottky diode having said second threshold voltage and having an anode coupled to the base of said NPN transistor and a cathode forming a second input terminal of said logic circuit.

4. A semiconductor integrated logic circuit as recited in claim 2 further comprising active pull-up circuit means coupled to said output terminal.

5. A semiconductor integrated circuit as recited in claim 4 wherein said active pull-up circuit means comprises:

a. a second reference voltage means coupled between said output terminal and said first power supply conductor; and b. a second PNP current source transistor having a collector coupled to said output terminal, an emitter coupled to said second terminal of said current limiting resistor and a base coupled to said first reference voltage means.

6. A semiconductor integrated logic circuit as recited in claim 5 wherein said second voltage reference means comprises serially interconnected Schottky diodes.

7. A semiconductor integrated circuit as recited in claim 2 wherein said first voltage reference means comprises serially interconnected Schottky diodes.

8. A semiconductor integrated logic circuit as recited in claim 2 where the difference between the logic 1 level and the logic 0 level produced at said output terminal is equal to the difference between the first threshold voltage and said second threshold voltage.

9. A semiconductor integrated logic circuit as recited in claim 2 wherein said first threshold is about 500 millivolts and second threshold is about 100 millivolts.

10. A semiconductor integrated logic circuit as recited in claim 2 wherein said circuit is a silicon semiconductor integrated circuit, said first Schottky diode is a barrier metal diode whose barrier metal is platinum silicide, and said second Schottky diode is a barrier metal diode whose barrier metal is tungsten or titanium.

* * * * *